United States Patent [19]

Chang et al.

[11] Patent Number: 5,378,909
[45] Date of Patent: Jan. 3, 1995

[54] FLASH EEPROM CELL HAVING GAP BETWEEN FLOATING GATE AND DRAIN FOR HIGH HOT ELECTRON INJECTION EFFICIENCY FOR PROGRAMMING

[75] Inventors: Chen-chi P. Chang, Newport Beach; Mei F. Li, Mission Viejo, both of Calif.

[73] Assignee: Hughes Aircraft Company, Los Angeles, Calif.

[21] Appl. No.: 136,852

[22] Filed: Oct. 18, 1993

[51] Int. Cl.⁶ .............................................. H01L 29/78
[52] U.S. Cl. .................... 257/316; 257/322; 257/408; 257/900
[58] Field of Search ............... 257/322, 316, 315, 318, 257/900, 408

[56] References Cited

U.S. PATENT DOCUMENTS

| | | | |
|---|---|---|---|
| 4,376,947 | 3/1983 | Chiu et al. | 257/336 |
| 4,663,645 | 5/1987 | Komori et al. | 257/408 |
| 4,939,558 | 7/1990 | Smayling et al. | 257/316 |
| 5,032,881 | 7/1991 | Sardo et al. | 257/324 |

FOREIGN PATENT DOCUMENTS 56-49574  5/1981  Japan ................................. 257/315

OTHER PUBLICATIONS

H. Kume, et al., "A Flash-Erase EEPROM Cell with an Asymmetric Source and Drain Structure", IEEE-IEDM 87, pp. 560–563.

R. Kazerounian, et al., "A 5 Volt High Density Poly-Poly Erase Flash EPROM Cell", IEEE-IEDM 88, pp. 436–439.

*Primary Examiner*—Robert P. Limanek
*Attorney, Agent, or Firm*—Elizabeth E. Leitereg; Terje Gudmestad; W. K. Denson-Low

[57] ABSTRACT

A flash or block erase electrically erasable programmable read-only memory (EEPROM) cell (10) includes a substrate (12) having a channel region (22), and a source (28) and a drain (32) formed in the substrate (12) on opposite sides of the channel region (22). A first oxide layer (19), a floating gate (20), a second oxide layer (24) and a control gate (26) are formed over the channel region (22). The cell (10) is programmed by hot electron injection from the drain (32) into the floating gate (20), and erased by Fowler-Nordheim tunneling from the floating gate (20) to the source (28). A gap (36) is provided between a sidewall (20a) of the floating gate (20) and the drain (32) to increase the electric field in the drain depletion region. An oxide sidewall spacer (38) is formed on the first oxide layer (19) in the gap (36) which traps electrons. The gap (36) and sidewall spacer (38) increase the hot electron injection efficiency, and enable programming to be accomplished at high speed, with low applied voltages and at high temperatures.

5 Claims, 3 Drawing Sheets

FLASH EEPROM CELL HAVING GAP BETWEEN FLOATING GATE AND DRAIN FOR HIGH HOT ELECTRON INJECTION EFFICIENCY FOR PROGRAMMING

BACKGROUND OF THE INVENTION

1. Field of the Invention

The present invention generally relates to the art of semiconductor memories, and more specifically to a flash or block erase electrically erasable programmable read-only memory (EEPROM) cell which is programmable at high speed, with low applied voltages and at high temperatures.

2. Description of the Related Art

A flash or block erase EEPROM semiconductor memory includes an array of cells which can be independently programmed and read. The size of each cell and thereby the memory are made small by omitting select transistors which would enable the cells to be erased independently. All of the cells are erased together as a block.

A conventional flash EEPROM is described in an article entitled "A FLASH-ERASE EEPROM CELL WITH AN ASYMMETRIC SOURCE AND DRAIN STRUCTURE", by H. Kume et al, IEDM, 25.8, 1987, pp. 560–563. Each cell includes a source and a drain which are formed on opposite sides of a channel region in a substrate. A first oxide layer, a floating gate, a second oxide layer and a control gate are formed over the channel region.

The cell is programmed by applying, typically, 12 V to the control gate, 6 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 6 V.

The cell is read by applying 5 V to the control gate and 1 V to the drain, and sensing the impedance of the cell at the source. If the cell is programmed and the threshold voltage (6 V) is higher than the control gate voltage (5 V), the control gate voltage will be insufficient to enhance the channel and the cell will appear as a high impedance. If the cell is not programmed or erased, the threshold voltage will be low, the control gate voltage will enhance the channel and the cell will appear as a low impedance.

The cell is erased by applying typically 12 V to the source, grounding the control gate and allowing the drain to float. This causes the electrons which were injected into the floating gate during programming to be removed by Fowler-Nordheim tunneling from the floating gate to the source.

A problem with the conventional flash EEPROM cell configuration is that semiconductor memories are often required to operate at high temperatures on the order of 125° C. As discussed in an article entitled "A 5 VOLT HIGH DENSITY POLY-POLY ERASE FLASH EPROM CELL", by R. Kazerounian et al, IEDM 1988, pp. 436–439, hot electron injection efficiency decreases with temperature, and the length of time required to program a conventional flash EEPROM cell at 125° C. is excessive for most practical applications.

SUMMARY OF THE INVENTION

The present invention provides a flash or block erase electrically erasable programmable read-only memory (EEPROM) cell in which the hot electron injection efficiency is increased over the conventional configuration to an extent such that the cell can be programmed in an acceptably short length of time at high temperatures on the order of 125° C. This enables the present cell to be advantageously utilized in practical applications at high temperatures. The increased hot electron injection efficiency also enables the programming voltages to be lower than in the prior art.

More specifically, the present flash EEPROM cell includes a substrate having a channel region, and a source and a drain formed in the substrate on opposite sides of the channel region. A first oxide layer, a floating gate, a second oxide layer and a control gate are formed over the channel region. The cell is programmed by hot electron injection from the drain into the floating gate, and erased by Fowler-Nordheim tunneling from the floating gate to the source.

A drain gap is provided between a sidewall of the floating gate and the drain to increase the electric field in the drain depletion region. An oxide sidewall spacer is formed on the first oxide layer in the drain gap which traps electrons. The gap and sidewall spacer increase the hot electron injection efficiency, and enable programming to be accomplished at high speed, with low applied voltages and at high temperatures.

A shield strata of a conductivity type opposite to that of the drain can be formed under the drain and in the drain gap region of the channel to increase the hot electron injection efficiency from the drain to the floating gate.

A source gap and sidewall spacer may also be provided on the source side of the floating gate. A lightly doped strata having the same conductivity type as the source can be formed under the source and in the source gap region of the channel to reduce the electric field in the source depletion region and enable a higher voltage to be applied between the source and gate for fast erasing.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
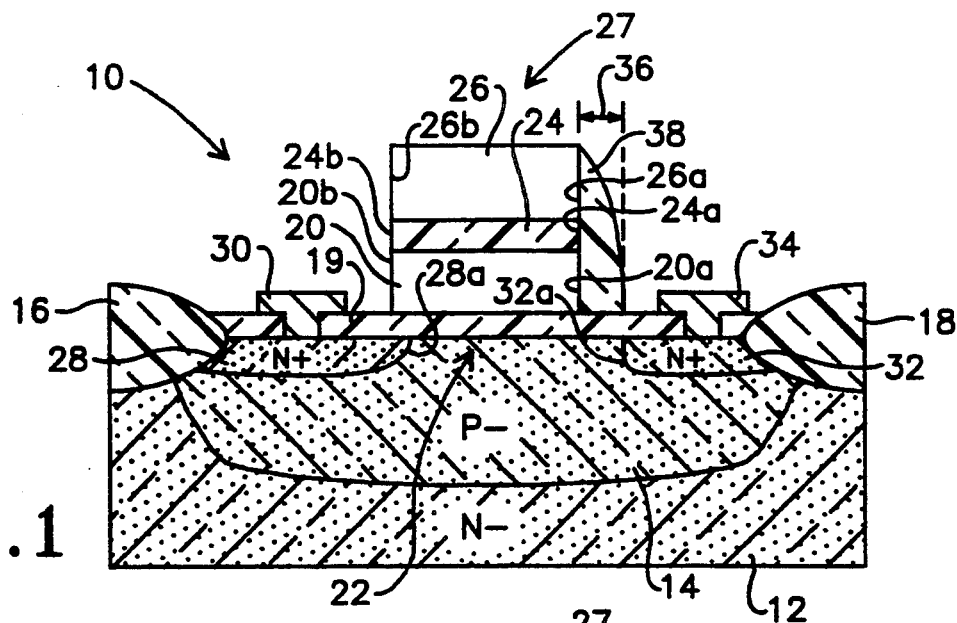
FIGS. 1 to 3 are simplified sectional views illustrating alternative respective embodiments of a flash or block erase electrically erasable programmable read-only memory (EEPROM) cell embodying the present invention.

A first embodiment of a flash or block erase electrically erasable programmable read-only memory (EEPROM) cell 10 is illustrated in FIG. 1, and includes a substrate 12 of N− conductivity type. A lightly doped well 14 of P− conductivity type is formed in the substrate 12 between field oxide regions 16 and 18 which isolate the cell 10 from adjacent cells (not shown) of a flash EEPROM memory array. It is further within the scope of the invention to provide the substrate 12 of P-conductivity type, in which case the well 14 is unnecessary.

A first insulating or tunnel oxide layer 19 is formed over the surface of the substrate 12 between the field oxide regions 16 and 18. A polysilicon floating gate 20 is formed over a central portion of the oxide layer 19. A channel region 22 is defined in the surface portion of the substrate 12 under the floating gate 20. A second insulating or oxide layer 24 is formed over the floating gate 20, and a polysilicon control gate 26 is formed over the oxide layer 24. The layer 24 may consist of three sublayers of oxide/nitride/oxide (ONO). The floating gate 20, oxide layer 24 and control gate 26 constitute a gate structure 27.

A source 28 of N+ conductivity type is formed in the surface portion of the substrate 12 between the field oxide region 16 and the gate structure 27. In order to facilitate erasing, the source 28 underlaps the floating gate 20 as illustrated. An ohmic metal contact 30 extends through a hole in the oxide layer 19 to the source 28. A drain 32 of N+ conductivity type is formed in the surface portion of the substrate 12 between the field oxide region 18 and the gate structure 27. An ohmic metal contact 34 extends through a hole in the oxide layer 19 to the drain 32. Although not illustrated, the cell 10 is preferably covered with a protective layer of insulating material such as borophosphorosilicate glass (BPSG).

The source 28 of the cell 10 is typically interconnected to the sources of all of the other cells in the array by the contact 30. The drain 32 of the cell 10 is connected to the drains of all of the other cells in one column or "bit line" of the array. The control gate 26 constitutes a section of one row or "word line" of the array which includes and interconnects the control gates of all of the cells in the row.

In accordance with the invention, a lateral drain gap 36 is provided between a sidewall 20a of the floating gate 20 and the left (as viewed in the drawing) edge 32a of the drain 32. An oxide sidewall spacer 38 is formed on the oxide layer 19 in the gap 36 and extends vertically over the sidewall 20a of the floating gate 20 and sidewalls 24a and 26a of the oxide layer 24 and control gate 26 respectively.

The cell 10 is programmed by applying, typically, 12 V to the control gate 26, 5 V to the drain 32 and grounding the source 28. A high electric field is created in the drain depletion region between the drain 32 and the floating gate 20 by the applied voltages which causes impact ionization to occur in this region. Hole-electron pairs are created by the impact of the drain current in the high field region (they hit the silicon atoms). Some of the electrons generated by impact ionization are called "hot electrons".

The control gate voltage causes hot electrons to be injected from the drain depletion region into the floating gate 20. These electrons are trapped in the floating gate 20 and create a negative charge therein which increases the threshold voltage of the cell 10. The read and erase operations are essentially similar to those for the conventional flash EEPROM described above.

The gap 36 increases the electric field in the drain depletion region over the conventional configuration which does not include the gap 36, thereby increasing the number and energy of hot electrons which are created by impact ionization. The number of hot electrons which are injected from the drain depletion region into the floating gate 20 is correspondingly increased. The length of the gap 36 is selected to maximize the hot electron injection efficiency, and will vary in accordance with the particular application. Typically, the length of the gap 36 will be 0.2–0.3 micrometers for a cell 10 with a channel length of one micrometer.

Although the left edge 32a of the drain 32 is illustrated as being directly aligned under the right edge of the spacer 38 such that the gap 36 is equal to the width of the spacer 38, it will be noted that the cell 10 may typically be subjected to thermal cycling during fabrication which will cause the source 28 and drain 32 to diffuse vertically and laterally. Although not explicitly illustrated, this will cause the drain 32 to underlap the spacer 38 slightly and the length of the gap 36 to be smaller than the width of the spacer 38.

The increased hot electron injection efficiency provided by the gap 36 enables the cell 10 to be programmed in an acceptably short period of time at high temperatures on the order of 125° C. The present cell 10 can therefore be advantageously utilized in high temperature applications which are not possible in the prior art.

The sidewall spacer 38 traps electrons which are injected therein from the drain depletion region but do not have sufficient energy to reach the floating gate 20. The volume of material available to trap electrons thereby includes the sidewall spacer 38 in addition to the floating gate 20.

The increased number of trapped electrons provided by the sidewall spacer 38 enables the threshold voltage of the cell 10 to be increased to the level required for programming with a lower voltage applied to the drain 32. This enables the drain voltage to be reduced from the typical prior art value of 6 V to approximately 5 V, with a corresponding reduction in power required to program the cell 10. This characteristic is especially important at high temperature for flash EEPROM operations.

Figure 2:
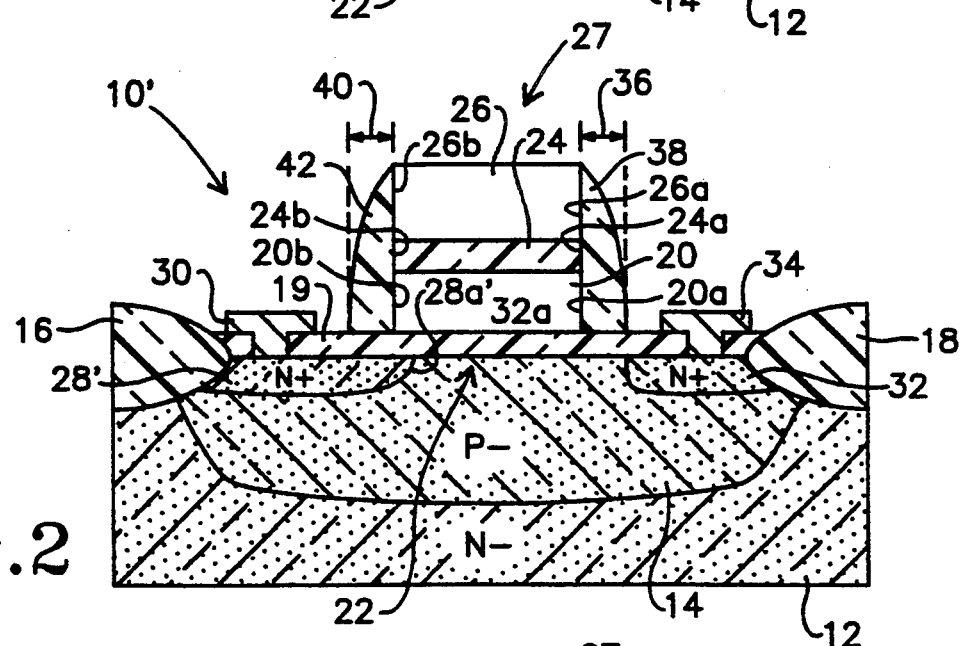

FIG. 2 illustrates another flash EEPROM cell 10' embodying the invention in which a source gap 40 and a sidewall spacer 42 are provided between a sidewall 20b of the floating gate 20 and a right edge 28a' of a source 28'. The gap 40 and spacer 42 are symmetrical to the gap 36 and spacer 38, with the spacer 42 extending vertically from the oxide layer 19 over the sidewall 20b, and sidewalls 24b and 26b of the oxide layer 24 and control gate 26 respectively.

Although only the gap 36 on the drain side is required for increasing the hot electron injection efficiency programming, the cell 10' is easier to fabricate than the cell 10 since the spacers 38 and 42 are naturally forces on the opposite sides of the gate structure 27 during fabrication as will be described below. The source 28' differs from the source 28 of the cell 10 in that is laterally spaced from the floating gate 20 by the gap 40.

In addition, a lightly doped N− implantation is done on the source side before the oxide sidewall spacers 38 and 42 are formed. The N− implantation underlaps the floating gate 20 to facilitate erasing.

Figure 3:
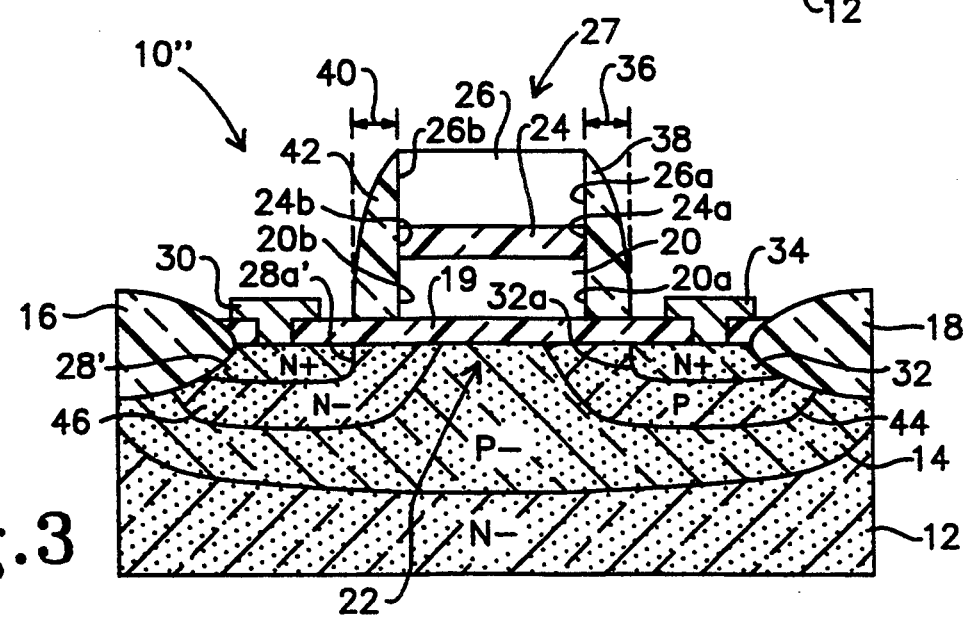

FIG. 3 illustrates another flash EEPROM cell 10" which incorporates the asymmetrical source and drain structure described in the above referenced article to Kume et al. In addition to the symmetrical sidewall spacers 38 and 42 of the cell 10', the cell 10" includes a shield strata 44 which is formed under the drain 32 and extends into the channel region 22 in the drain gap 36.

The shield strata 44 is doped P—, the opposite conductivity type to the drain 32, and provides the function of increasing the hot electron injection efficiency between the drain and the shield strata 44.

The cell 10″ further includes a lightly doped N— strata 46 which is formed under the source 28′ and extends into the channel region 22 in the source gap 40. The strata 46 reduces the electric field in the source depletion region and enables a higher voltage to be applied to the source 28′ for erasing the cell 10″.

Figure 4:
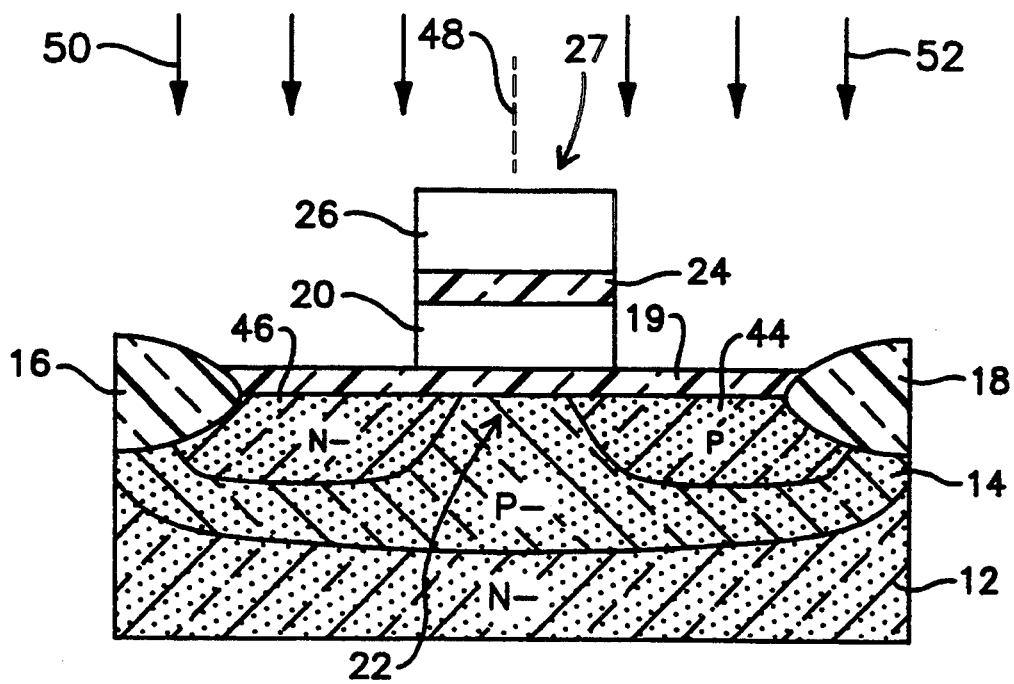
FIGS. 4 to 7 are simplified sectional views illustrating a method of fabricating the flash EEPROM cell of FIG. 3 according to present invention.

FIGS. 4 to 7 illustrate a method of fabricating the cell 10″, in which the gate structure 27 and sidewall spacers 38 and 42 provide self-alignment functions. In FIG. 4, the well 14, field oxide regions 16 and 18, oxide layer 19, floating gate 20, oxide layer 24 and control gate 26 are formed using conventional fabrication techniques.

The portion of the structure leftward of a line 48 covered by a mask (not shown) and the lightly doped strata 46 is formed by ion implantation of an N-type dopant such as phosphorous or arsenic as indicated by arrows 50. The left edge of the gate structure 27 acts as a self-aligned mask for defining the right edge of the strata 46.

The portion of the structure rightward of the line 48 is then masked, and the shield strata 44 is formed by ion implantation of a P-type dopant such as boron as indicated by arrows 52. The right edge of the gate structure 27 acts as a self-aligned mask for defining the left edge of the strata 44.

Figure 5:
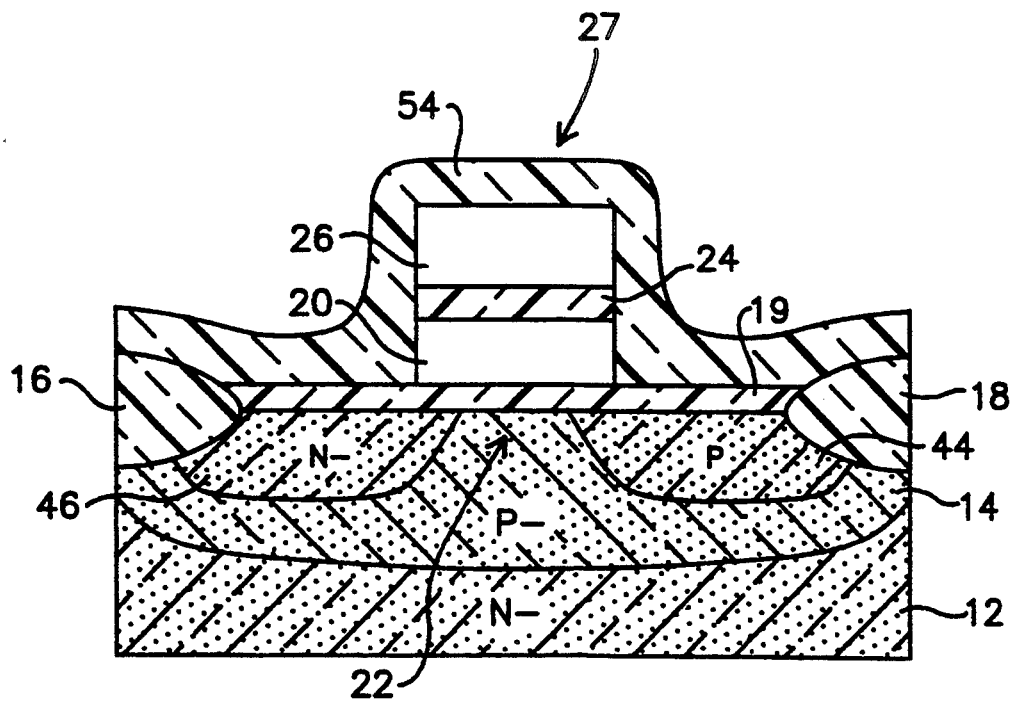
Figure 6:
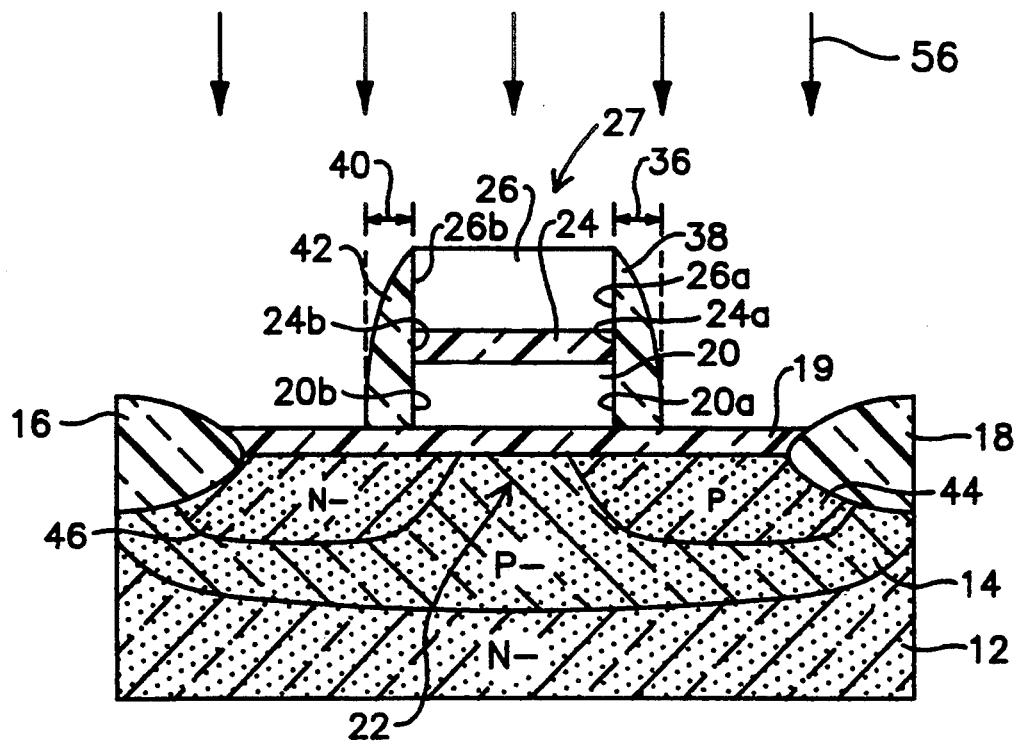

As illustrated in FIG. 5, the sidewall spacers 38 and 42 are formed by depositing a layer 54 of silicon dioxide approximately 3,000 angstroms thick over the structure. Then, as illustrated in FIG. 6, the structure is subjected to anisotropic dry etching as indicated by arrows 56. Since the thickness of the silicon dioxide layer 54 is greater at the sidewalls of the gate structure 27 than on the horizontal surfaces of the control gate 26 and oxide layer 19, performing the etching step sufficiently to remove the silicon dioxide 54 from the horizontal surfaces will leave the sidewall spacers 38 and 42 in place as illustrated in FIG. 6.

Figure 7:
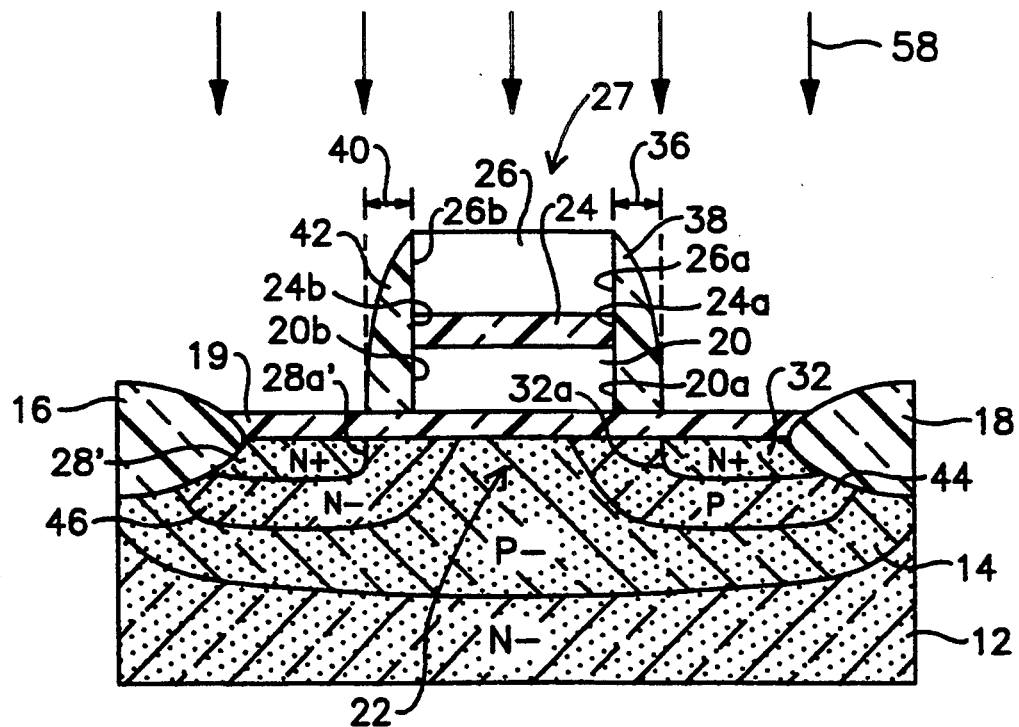

As illustrated in FIG. 7, the source 28′ and drain 32 are formed by ion implantation of an N-type dopant such as phosphorous or arsenic as indicated by arrows 58. The sidewall spacers 38 and 42 act as self-aligned masks for defining the left and right edges of the drain 32 and source 28′ respectively.

Before or after the implantation step of FIG. 7, the structure may be subjected to thermal annealing to cause vertical and lateral diffusion of the dopant in the strata 44 and 46. The source and drain contacts 30 and 34 are formed, and other conventional steps are performed including vapor deposition of BPSG and rapid thermal annealing to flow the oxide and activate the source and drain 28′ and 32 to create the finished cell 10 as illustrated in FIG. 3.

While several illustrative embodiments of the invention have been shown and described, numerous variations and alternate embodiments will occur to those skilled in the art, without departing from the spirit and scope of the invention.

For example, although the flash EEPROM cells as described and illustrated have N-type channels and the hot charge carriers which are injected into the floating gate are electrons, it is within the scope of the invention to provide a P-channel cell in which the injected hot charge carriers are holes. The invention is also applicable to flash EEPROMs having modified gate structures, such as split or pass gates.

Accordingly, it is intended that the present invention not be limited solely to the specifically described illustrative embodiments. Various modifications are contemplated and can be made without departing from the spirit and scope of the invention as defined by the appended claims.

We claim:

1. An electrically erasable programmable read-only memory (EEPROM) cell, comprising:
   a semiconductor substrate;
   a channel formed in the substrate;
   a source and a drain formed in the substrate on opposite sides of the channel respectively;
   a first insulating layer formed over the channel;
   a floating gate formed over the first insulating layer and having a sidewall which faces the drain and is laterally spaced therefrom by a predetermined drain gap, wherein the floating gate further has a sidewall which faces the source and is laterally spaced therefrom by a source gap which is substantially symmetrical to said drain gap;
   a second insulating layer formed over the floating gate;
   a control gate formed over the second insulating layer;
   an oxide drain sidewall spacer formed over the first insulating layer in said drain gap;
   an oxide source sidewall spacer formed over the first insulating layer in said source gap;
   a shield strata formed in the substrate which underlies and has opposite conductivity type to the drain, and extends into the channel in said drain gap; and
   lightly doped strata formed in the substrate which underlies and has the same conductivity type as the source, and extends into the channel in said source gap.

2. A cell as in claim 1, in which:
   the second insulating layer and the control gate have respective sidewalls which are vertically aligned with said sidewall of the floating gate; and
   the sidewall spacer extends vertically from the first insulating layer over said sidewalls of the floating gate, second insulating layer and control gate.

3. A cell as in claim 1, in which:
   the channel has P-type conductivity;
   the source and drain have N-type conductivity; and
   said hot charge carriers are hot electrons.

4. A cell as in claim 1, in which said drain gap has a length which is selected to substantially maximize injection of hot charge carriers from the drain into the floating gate.

5. A cell as in claim 1, in which:
   the channel has a length of approximately one micrometer; and
   said drain gap has a length of approximately 0.2–0.3 micrometers.

* * * * *